United States Patent [19]
Suzuki et al.

[11] Patent Number: 5,807,519
[45] Date of Patent: Sep. 15, 1998

[54] PLASTIC MOLDS AND METHODS OF PRODUCING SAME

[75] Inventors: Toshiharu Suzuki; Tatsuhiko Ozaki; Hirokazu Matsueda, all of Aichi; Yorikazu Tamura; Tsuneo Hagiwara, both of Kanagawa, all of Japan

[73] Assignees: Takemoto Yushi Kbushiki Kaisha, Aichi; Teijin Seiki Co., Ltd., Osaka, both of Japan

[21] Appl. No.: 879,147

[22] Filed: Jun. 19, 1997

[30] Foreign Application Priority Data

Jun. 19, 1996 [JP] Japan ................................. 8-180046

[51] Int. Cl.⁶ ........................... B29C 35/08; B29C 41/02
[52] U.S. Cl. ........................ 264/401; 249/134; 264/236; 264/308; 522/71; 522/76; 522/90; 522/96; 525/404; 525/450
[58] Field of Search ................................. 264/236, 308, 264/401; 249/134; 522/71, 76, 90, 96; 525/404, 450

[56] References Cited

U.S. PATENT DOCUMENTS

| | | | |
|---|---|---|---|
| 5,510,066 | 4/1996 | Fink et al. | 264/40.1 |
| 5,591,563 | 1/1997 | Suzuki et al. | 522/96 X |

*Primary Examiner*—Leo B. Tentoni
*Attorney, Agent, or Firm*—Majestic, Parsons, Siebert & Hsue P.C.

[57] ABSTRACT

A plastic mold is produced by first repeating the process of forming a layer of a photocurable resin composition of a specified kind and exposing it to actinic radiation to at least partially photocure it to produce a photocured layered structure having a glass transition temperature of 70°–120° C. This structure is then subjected to a post-cure process at a temperature high than the glass transition temperature by 30°–100° C. Plastic molds made by this method have superior heat distortion temperature and tensile elastic modulus.

15 Claims, 1 Drawing Sheet

PLASTIC MOLDS AND METHODS OF PRODUCING SAME

BACKGROUND OF THE INVENTION

This invention relates to plastic molds and methods of producing plastic molds.

Casings for electrical appliances for home use, electronic devices and communication apparatus, as well as machine parts are frequently made by molding various kinds of plastics. When such molded plastic objects are to be mass-produced, a small number of prototypes are preliminarily produced as a test. For producing such prototypes, and also for making final products if the total number to be produced is not too large, plastic molds are frequently made use of because they can be produced easily. This invention relates to methods of producing such plastic molds directly by stereolithography, as well as plastic molds produced by such methods.

General prior art methods of producing such plastic molds include the vacuum casting method using silicone resin, the resin transfer molding (RTM) method using unsaturated polyester resin, the hand lay-up method and the spray-up method. These prior art methods are disadvantageous in that they require much time and labor to produce plastic molds because a master model must be made first with a metal, wood, clay or plaster before the production of plastic molds. Indeed, very much labor and time are typically expended for the production of a plastic mold since frequent design changes are made during the production, because it is the very purpose of using plastic molds.

Attempts have also been made at stereolithography of photocurable resin compositions based on data inputted in a three-dimensional CAD. According to such a prior art attempt, a layer of a photocurable resin composition is formed first and, after at least a portion of this layer is photocured by exposing it to a beam of actinic radiation, a new layer of a photocurable resin composition is formed on the photocured layer. At least a portion of this new layer is photocured by exposing it to a beam of actinic radiation, and this process is repeated to form a photocured layered structure. In order to improve the mechanical properties of such a layered structure, it is usually subjected to a post-cure process thereafter. Various kinds of photocurable resin compositions for such a purpose in stereolithography have been known (for example, Japanese Patent Publications Tokkai 6-199962, 7-26060 and 7-26062 and U.S. Pat. No. 5,591,563). Even if such photocurable resin compositions are used to carry out stereolithography by a prior art method, however, the results are not satisfactory because thermal and mechanical properties of the plastic molds thus obtained are not sufficiently acceptable and their durability is quite poor as a mold. If a prior art method is used, the heat distortion temperature of plastic molds is lower than about 70° C. and their tensile elastic modulus is less than about 8 GPa. Thus, the distortion and breakage of plastic molds are significant even when they are used for injection molding of general thermoplastics such as ABS resin which is used under a relatively low-temperature, low-pressure condition. In fact, production of even as few as only about 10–20 prototypes or products is not possible.

SUMMARY OF THE INVENTION

It is therefore an object of this invention to eliminate the problems of prior art methods of producing plastic molds as described above.

This invention is based on the discovery by the present inventors, as a result of their diligent studies in view of the aforementioned problems of prior art technologies, that use should be made of photocurable resin composition of a special kind to form a photocured layered structure having a specified glass transition temperature and to carry out a post-cure process on this photocured layered structure at a specified temperature higher that this glass transition temperature.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings.

DETAILED DESCRIPTION OF THE INVENTION

According to a method of producing a plastic mold embodying this invention, a layer of photocurable resin composition of a specified kind is formed and at least a portion of this layer is photocured by exposing it to a beam of actinic radiation. Thereafter, another layer of the photocurable resin composition is formed on the photocured substance and its surface is exposed to the actinic radiation to photocure at least a portion of the surface. After these steps are repeated to obtain a photocured layered structure having a glass transition temperature in the range of 70°–120° C., this structure is subjected to a post-cure process at a temperature higher than this glass transition temperature by 30°–100° C. The photocurable resin composition of the aforementioned specified kind is characterized as containing an effective quantity of a photoinitiator and 50–400 weight parts of a filler to be described below for 100 weight parts of a photocurable liquid of the kind described below, as well as less than 5 weight parts of a salt of phosphoric acid ester shown by Formula (1) given below per 100 weight parts of this filler. The photocurable liquid, referenced above, is a mixture of unsaturated urethane of the kind described below and a vinyl monomer, which is either N-(meth)acryloyl morpholine or a mixture of N-(meth)acryloyl morpholine and di-ol di(meth)acrylate, at a weight ratio of (unsaturated urethane)/(vinyl monomers)=80/20–30/70. The unsaturated urethane, referenced above, is characterized as having within its molecule a total of three or more methacryloyl and acryloyl groups as radical polymerizable groups and an average molecular weight of 150–250 per radical polymerizable group. The filler, referenced above, is a mixture of inorganic fine particles and inorganic whiskers with average fiber length of 1–70 μm, both surface-treated with (meth)acryloyl modified silane or vinyl modified silane. Formula (1) given as follows:

Formula (1)

where R is a hydrocarbon group with 1–6 carbon atoms, Y is a residual group obtained by removing hydroxyl group of polyether di-ol, B is monoamine base and m and n are each 1 or 2 such that m+n=3.

The unsaturated urethane according to this invention in the aforementioned photocurable liquid is characterized wherein there are within the molecule three or more methacryloyl and acryloyl groups as radical polymerizable groups and the molecular weight per radical polymerizable group is 150–250 on the average. Such unsaturated urethane may be selected from known kinds of unsaturated urethane, examples thereof including: (1) unsaturated urethane obtained from 1 mole of polyisocyanate having isocyanate functionality of n and n moles of (meth)acrylic partial ester of poly-ol having a hydroxy group in the molecule (hereinafter referred to as (meth)acryl ester mono-ol) (as disclosed in Japanese Patent Publication Tokkai 4-72353); (2) unsaturated urethane obtained from 1 mole of n-hydric poly-ol, n mole of diisocyanate and n mole of aforementioned (meth)acryl ester mono-ol (as disclosed in Japanese Patent Publication Tokkai 2-145616); (3) unsaturated urethane obtained from 1 mole of n-hydric poly-ol and n mole of isocyanatoalkyl (meth)acrylate (as disclosed in Japanese Patent Publications Tokkai 3-3163116 and 6-199962); (4) unsaturated urethane obtained from 1 mole of poly-ol (meth) acrylate having n hydroxyl groups in the molecule and n mole of isocyanate alkyl (meth)acrylate (as disclosed in Japanese Patent Publication Tokkai 4-53809); and (5) mixtures of unsaturated urethane described in (1)–(4) above.

As described above, the present invention makes use of unsaturated urethane characterized wherein there are within the molecule three or more methacryloyl and acryloyl groups as radical polymerizable groups and the molecular weight per radical polymerizable group, as an indicator of the concentration of such radical polymerizable groups, is 150–250 on the average. Unsaturated urethane having such concentration of radical polymerizable groups can be obtained by appropriately selecting a material for general synthesis of unsaturated urethane. In the case of polyisocyanate, for example, the molecular weight and the number of functional hydroxy groups are appropriately selected for a combination. In the case of partial ester of poly-ol (meth)acrylate, the number of functional (meth) acryloyl groups and other factors are appropriately selected for a combination.

As described above, the unsaturated urethane for the photocurable liquid according to this invention is characterized as having within its molecule a total of three or more methacryloyl and acryloyl groups as radical polymerizable groups, but those having methacryoyl and acryloyl groups within the molecule at a molar ratio of ⅓–2/1 and 3–8 radical polymerizable groups per molecule are desirable.

Examples of such unsaturated urethane include: (1) reaction product of diisocyanate and tri-ol monomethacrylate·monoacrylate at molar ratio of 1/2, reaction product of diisocyanate/tri-ol monomethacrylate·monoacrylate/di-ol monomethacrylate at molar ratio of 1/1/1, and reaction product of diisocyanate/ tri-ol monomethacrylate·monoacrylate/di-ol monoacrylate at molar ratio of 1/1/1; (2) reaction product of diisocyanate/ tri-ol monomethacrylate·monoacrylate/tri-ol dimethacrylate at molar ratio of 1/1/1 and reaction product of diisocyanate/ tri-ol monomethacrylate·monoacrylate/tri-ol diacrylate at molar ratio of 1/1/1; (3) reaction product of tri-ol/ diisocyanate/tri-ol monomethacrylate·monoacrylate at molar ratio of 1/3/3, reaction product of tri-ol/diisocyanate/ tri-ol monomethacrylate·monoacrylate/di-ol monomethacrylate at molar ratio of 1/3/2/1 or 1/3/1/2, and reaction product of tri-ol/diisocyanate/tri-ol monomethacrylate·monoacrylate/di-ol monoacrylate at molar ratio of 1/3/2/1 or 1/3/1/2; (4) reaction product of tetra-ol/diisocyanate/tri-ol monomethacrylate·monoacrylate at molar ratio of 1/4/4, reaction product of tetra-ol/ diisocyanate/tri-ol monomethacrylate·monoacrylate/di-ol monomethacrylate at molar ratio of 1/4/3/1 and 1/4/2/2, and reaction product of tetra-ol/diisocyanate /tri-ol monomethacrylate·monoacrylate/di-ol monoacrylate at molar ratio of 1/4/3/1 and 1/4/2/2; and (5) reaction products of tetra-ol/diisocyanate/di-ol monomethacrylate/di-ol monoacrylate at molar ratio of 1/4/2/2 and 1/4/3/1.

Examples of materials that may be used preferably for the synthesis of aforementioned unsaturated urethane include: (1) di-hydric alcohols such as ethylene glycol, propylene glycol, 1,4-butane di-ol and 1,6-hexane di-ol as well as their mono(meth)acrylate; (2) tri-hydric alcohols such as glycerine and trimethylolpropane, tri-ols such as polyether tri-ol such as their ethylene oxide or propylene oxide adducts and their monomethacrylate·monoacrylate; and (3) polyether tetraols such as pentaerythritol and ethylene oxide or propylene oxide adducts of pentaerythritol. Known kinds of aromatic diisocyanate can be used but tolylene diisocyanate and methylene-bis-(4-phenylisocyanate) are preferred.

It is for the following reasons that the unsaturated urethane for photocurable liquid according to this invention should have molecular weight within the range specified above per radical polymerizable group contained therein. If use is made of unsaturated urethane with molecular weight less than 150 per radical polymerizable group, generation of deformation and micro-cracks caused by internal stress is significant in plastic molds produced therefrom. If use is made of unsaturated urethane with molecular weight greater than 250 per radical polymerizable group, on the other hand, plastic molds with desired thermal and mechanical properties cannot be obtained.

The vinyl monomer which is the other constituent of the photocurable liquid is N-(meth)acryloyl morpholine alone or a mixture of N-(meth)acryloyl morpholine and di-ol di(meth)acrylate. Examples of N-(meth)acryloyl morpholine include N-acryloyl morpholine and N-methacryloyl morpholine but N-methacryloyl morpholine is more preferred. Examples of di(meth)acrylate to be mixed with N-(meth)acryloyl morpholine include: (1) diacrylates and dimethacrylates of alkane di-ol with 2–6 carbon atoms such as ethylene glycol, propylene glycol, 1,4-butane di-ol, neopentyl glycol and 1,6-hexane di-ol; (2) diacrylates and dimethacrylates of di-ols having alicyclic hydrocarbon group with 6–12 carbon atoms such as cyclohexane dimethanol, cyclohexene dimethanol and dicyclopentyl dimethanol; (3) diacrylates and dimethacrylates of (poly) ester di-ol such as diacrylates and dimethacrylates of 1,6-hexane di-ol hydroxycaprate and diacrylates and dimethacrylates of neopentyl glycol hydroxy pivalate obtained by reacting aliphatic lactone or aliphatic monohydroxyl carboxylic acid with 4–6 carbon atoms with aforementioned alkane di-ol or di-ols; and (4) diacrylates and dimethacrylates of alkoxylated bisphenols with alkoxyl group with 2–3 carbon atoms such as 2,2-bis(hydroxy ethoxy phenyl) propane, 2,2-bis(hydroxy diethoxy phenyl) propane, bis(hydroxy propoxy phenyl)methane and bis (hydroxy dipropoxy phenyl)methane. Preferred among these are diacrylates of alkane di-ol, diacrylates of di-ols having alicyclic hydrocarbon group and diacrylates of alkoxylated bisphenol.

The ratio of unsaturated urethane and vinyl monomer in the photocurable liquid according to this invention is (unsaturated urethane)/(vinyl monomer)=80/20–30/70 (by weight).

As explained above, the photocurable resin composition according to this invention contains an effective quantity of a photoinitiator. The effective quantity is usually 0.1–10 weight parts, and more preferably 1–5 weight parts, per 100 weight parts of the photocurable liquid described above. The invention does not impose any particular limitation on the kind of photoinitiator to be used. Examples of such photoinitiator include: (1) carbonyl compounds such as benzoin, α-methyl benzoin, anthraquinone, chloroanthraquinone and acetophenone; (2) sulfur compounds such as diphenyl sulfide, diphenyl disulfide and dithiocarbamate; and (3) polycyclic aromatic compounds such as α-chloromethyl naphthalene and anthracene. In addition to a photoinitiator, use may also be made of a co-initiator such as n-butyl amine, triethanol amine, N,N-dimethyl aminobenzene sulfonic diallylamide and N,N-dimethyl aminoethyl methacrylate.

Besides an effective quantity of a photoinitiator, the photocurable resin composition of this invention contains 50–400 weight parts of a filler per 100 weight parts of a photocurable liquid of the kind explained above. The filler, according to this invention, is a mixture of inorganic fine particles and inorganic whiskers of average fiber length 1–70 μm, both surface-treated with (meth)acryloyl modified silane or vinyl modified silane (hereinafter referred to as a silane coupling agent).

Examples of inorganic fine particles include silica, alumina, clay, calcium carbonate, glass beads and all kinds of metallic powder with average particle diameter 0.1–50 μm. Of the above examples, glass beads are preferable, and glass beads with average particle diameter 3–30 μm are even more preferred.

Examples of aforementioned inorganic whiskers include potassium titanate fibers, alumina fibers, magnesium sulfate fibers, magnesium borate fibers and aluminum borate fibers, all surface-treated with a silane coupling agent and having average fiber length of 1–70 μm. Of these, aluminum borate fibers with fiber diameter of 0.3–1 μm and average fiber length of 10–20 μm are preferred.

Examples of the silane coupling agent, which is used for treating the surfaces of inorganic whiskers and inorganic fine particles, include: (1) (meth)acryloyl modified alkoxy silane such as (meth)acryloyloxypropyl trimethoxy silane and di(meth)acryloyloxypropyl dimethoxy silane; and (2) vinyl modified alkoxy silane such as vinyl trimethoxy silane, divinyl dimethoxy silane, vinyloxypropyl trimethoxy silane and divinyloxypropyl dimethoxy silane. Of these, methacryloyloxypropyl trimethoxy silane is preferred. No limitation is imposed on the method of surface treatment of inorganic whiskers or inorganic fine particles by using such a silane coupling agent or on the amount to be used for the surface treatment. In general, however, a silane coupling agent is used at the rate of 0.1–20 weight % of the objects to be treated, and more preferably 1–10 weight %.

It is particularly preferred to use as the filler according to this invention a combination of glass beads with average particle diameter of 3–30 μm and aluminum borate fibers with fiber diameter 0.3–1 μm and average fiber length of 10–20 μm, both surface-treated with a silane coupling agent. In this application, it is most preferable to have 100–300 weight parts of the former and 20–80 weight parts of the latter contained against 100 weight parts of the photocurable liquid.

In addition to a photocurable liquid, a photoinitiator and a filler as described above, the photocurable resin composition which is used according to this invention also contains a salt of phosphoric acid ester shown by aforementioned Formula (1). The salt of phosphoric acid ester shown by Formula (1) is obtained by using monoamine to neutralize acidic phosphoric acid esters obtained by phosphorizing polyether di-ol with one end closed by a hydrocarbon group.

In Formula (1), Y is a residual group obtained by removing hydroxyl group of polyether di-ol. Examples of such polyether di-ol include polyoxy ethylene di-ol, polyoxy propylene di-ol, polyoxy butylene di-ol and polyoxy alkylene di-ol having two or more different kinds of oxyalkylene units. Among such polyether diols, those with repetition number of oxyalkylene units in the range of 5–100 are preferable and those in the range of 15–60 are even more preferable. Those with the oxyalkylene units comprising oxypropylene units or both oxypropylene units and oxyethylene units with molar % ratio of oxypropylene units/oxyethylene units=100/0–50/50 can be used advantageously.

The hydrocarbon groups which close one end of such polyether di-ols, as described above, are hydrocarbon groups with 1–6 carbon atoms. Examples of such hydrocarbon groups include: (1) alkyl groups such as methyl group, ethyl group, isopropyl group, butyl group and hexyl group; (2) cyclohexyl group; and (3) phenyl group. Of these, alkyl groups with 2–4 carbon atoms are preferred.

In Formula (1), B indicates a monoamine base which forms acidic phosphoric acid ester and salt. Examples of such monoamine base include: (1) alkanolamines such as monoethanolamine, diethanolamine, triethanolamine and isopropanolamine; (2) N-alkylalkanolamines such as methyl diethanolamine, ethyl monoethanolamine and butyl diethanolamine; and (3) cyclic amines such as morpholine and pyridine. Of the above, morpholine is preferred.

According to this invention, the content of the salt of phosphoric acid ester shown by Formula (1) is less than 5 weight parts, and more preferably 0.5–3 weight parts against 100 weight parts of the aforementioned filler.

For forming a photocured layered structure by using a photocurable resin composition according to this invention, a prior art method of stereolithography by direct sketching with actinic radiation may be used. Although this invention does not limit the thickness of each layer of such a photocured layered structure, it is usually less than 1 mm, and preferably about 10–200 μm. As explained above, a photocured layered structure with glass transition temperature 70°–120° C. is formed according to this invention. In this regard, it is to be noted that "the glass transition temperature" is herein defined as the temperature at which the loss tangent (tan δ), or the ratio between the loss modulus and the storage modulus in the measurement of dynamic viscoelasticity, reaches its largest value. A layered structure having such a glass transition temperature can be formed by controlling the hardness of the photocurable resin composition as it is photocured. This may be done, for example, through the curing characteristic of the photocurable liquid contained in the photocurable resin composition or the energy of radiation provided per unit volume of the photocurable liquid. The amount of radiant energy per unit volume is determined by the thickness of each layer to be photocured and the incident energy per unit surface (intensity of exposure), and the intensity of exposure can be easily controlled by varying operating conditions such as the output of the actinic radiation, the speed of scanning and the interval of scan lines. According to this invention, these photocuring conditions are appropriately selected to form a layered structure having a specified glass transition temperature.

According to this invention, the photocured layered structure is obtained in the so-called green condition, by repeating the steps of layer formation with a photocurable resin composition and of photocuring by exposure to actinic radiation. Although the glass transition temperature of the photocured layered structure according to this invention is said to be 70°–120° C., it is preferable to make it 75°–110°

C. If the glass transition temperature of the photocured layered structure is less than 70° C., the hardened object, which is eventually obtained by subjecting such a photocured layered structure to a post-cure process, tends to develop minute cracks, adversely affecting its mechanical properties and resulting in a plastic mold with poor resistance against use. If the glass transition temperature of the photocured layered structure exceeds 120° C., on the other hand, the hardened object, which is eventually obtained after a post-cure process, has inferior thermal and mechanical properties, showing little effect of the post-cure process.

According to this invention, a photocured layered structure thus formed and having a specified glass transition temperature is subjected to a post-cure process at a heating temperature high than this glass transition temperature by 30°–100° C., but it is preferable to carry out the post-cure process at a higher temperature than the glass transition temperature by 40°–85° C. Although the invention does not impose any limitation as to the length of time for the post-cure, it is normally 1–5 hours. As the post-cure process according to this invention, an already photocured layered structure may be exposed to actinic radiation to harden its surface first and the structure may then be subjected to a heat treatment. As actinic radiation for photocuring, visible light, ultraviolet radiation and electron beams may be used according to this invention, but ultraviolet laser light may be favorably applicable.

Photocurable liquids containing unsaturated urethane by 30–80 weight, N-(meth)acryloyl morpholine by 3–10 weight % and di-ol di(meth)acrylate for the rest are preferred examples for use in methods according to this invention for producing plastic molds. Those containing unsaturated urethane by 40–70 weight %, N-(meth)acryloyl morpholine by 5–8 weight % and di-ol di(meth)acrylate by 22–55 weight % are even more preferred. According to this invention, it is important to consider the molecular weight of unsaturated urethane per radical polymerizable group contained therein in setting the proportion of the unsaturated urethane contained in the photocurable liquid. If the weight percentage of unsaturated urethane is W and its molecular weight per radical polymerizable group is P, it is desirable that W/P= 0.30±0.03.

As unsaturated urethane to be used for photocurable liquids having such a composition as described above, those having methacryloyl and acryloyl groups at molar ratio of 1/3–2/1 are preferred. Examples of such preferred unsaturated urethane include reaction product of diisocyanate and tri-ol monomethacrylate·monoacrylate at molar ratio of ½, reaction product of tri-ol, diisocyanate and tri-ol monomethacrylate·monoacrylate at molar ratio of 1/3/3, tri-ol, diisocyanate, tri-ol monomethacrylate·monoacrylate and di-ol monomethacrylate at molar ratio of 1/3/2/1 or 1/3/1/2, reaction product of tetra-ol, diisocyanate, di-ol methacrylate and di-ol monoacrylate at molar ratio of 1/4/2/2 or 1/4/3/1, reaction product of tetra-ol, diisocyanate, tri-ol monomethacrylate·monoacrylate at molar ratio of 1/4/4, and reaction product of tetra-ol, diisocyanate, tri-ol monomethacrylate·monoacrylate and di-ol monomethacrylate at molar ratio of 1/4/3/1, 1/4/2/2 or 1/4/1/3. As examples of tri-ol in the above, trihydric alcohols such as glycerine and trimethylol propane and polyether triols such as ethylene oxide and propylene oxide adducts of these trihydric alcohols may be used advantageously. As examples of tetra-ol in the above, pentaerythritol and polyether tetra-ols such as ethylene oxide and propylene oxide adducts of pentaerythritol may be used advantageously. As examples of diisocyanate, known kinds of diisocyanate may be used but aromatic diisocyanate such as tolylene diisocyanate, methylenebis-(4-phenyl isocyanate) and isophorone diisocyanate and aliphatic·alicyclic diisocyanate may be used advantageously.

By a method of stereolithography according to this invention with a photocurable resin composition on the basis of data inputted to a three-dimensional CAD, plastic molds can be produced much more quickly than by prior art methods requiring the production of a master model and plastic molds with superior thermal and mechanical properties and hence with improved resistance against use can be obtained as compared to those produced by prior art methods of stereolithography using a conventionally known kind of photocurable resin composition. If use is made, in particular, of a photocurable resin composition containing, as filler, glass beads with average particle diameter 3–30 μm and aluminum borate fibers with fiber diameter of 0.3–1 μm and average fiber length 10–20 μm, both surface-treated with (meth)acryloyl modified silane or vinyl modified silane at weight ratio of (photocurable liquid)/(glass beads)/ (aluminum borate fibers)=100/100–300/20–80, it is possible to obtain plastic molds with heat distortion temperature over 240° C. and tensile elastic modulus greater than 17 GPa, suitable for injection molding and compression molding with not only general thermoplastics but also some engineering plastics and thermosetting resins. Thus, methods according to the present invention are particularly useful when only a few test samples or products are to be produced.

In what follows, the invention will be described by way of test examples and comparison examples but the invention is not intended to be bounded by these test examples. In what follows, "part" and "%" will respectively mean "weight part" and "weight %."

Test Examples
Part 1: Preparation of photocurable liquids

Unsaturated Urethane (a-1) (reaction product of glycerine monoacrylate monomethacrylate and tolylene diisocyanate at molar ratio of 2/1) was synthesized according to the method described in Japanese Patent Publication 6-199962. Unsaturated Urethane (a-1) thus synthesized (45 parts), acryloyl morpholine (8 parts) and dicyclopentyl dimethylene monoacrylate monomethacrylate (47 parts) were mixed and dissolved at room temperature to prepare Photocurable Liquid (A-1). Photocurable Liquids (A-2), (A-3), (B-1), (B-2), (RA-1)–(RA-8) and (RB-1) were prepared similarly, as summarized in Table 1.

TABLE 1

| Photo-curable Liquid Kind | Unsaturated Urethane | | Acryloyl Morpholine | Di-ol di(meth) acrylate | |
|---|---|---|---|---|---|
| | Kind | Amount (Part) | Amount (Part) | Kind | Amount (Part) |
| A-1 | a-1 | 45 | 8 | c-1 | 47 |
| A-2 | a-2 | 55 | 6 | c-2 | 39 |
| A-3 | a-3 | 65 | 8 | c-3 | 27 |
| B-1 | a-1 | 60 | 40 | — | — |
| B-2 | a-4 | 60 | 30 | c-4 | 10 |
| RA-1 | r-1 | 45 | 8 | c-1 | 47 |
| RA-2 | r-2 | 45 | 8 | c-1 | 47 |
| RA-3 | r-3 | 55 | 6 | c-2 | 39 |
| RA-4 | r-4 | 55 | 6 | c-2 | 39 |
| RA-5 | a-1 | 53 | 0 | c-1 | 47 |
| RA-6 | a-2 | 61 | 0 | c-2 | 39 |
| RA-7 | r-5 | 60 | 8 | c-1 | 32 |
| RA-8 | r-6 | 50 | 6 | c-2 | 44 |
| RB-1 | r-7 | 60 | 40 | — | — |

Where:
a-1: Reaction product of glycerine monoacrylate monomethacrylate and tolylene diisocyanate at molar ratio of 2/1, having methacryloyl groups and acryloyl groups at molar ratio of 1/1 as radical polymerizable groups in the molecule and molecular weight of 151 per radical polymerizable group;

a-2: Reaction product of glycerine monoacrylate monomethacrylate, hydroxyethyl methacrylate and tolylene diisocyanate at molar ratio of 1/1/1, having methacryloyl groups and acryloyl groups at molar ratio of 2/1 as radical polymerizable groups in the molecule and molecular weight of 173 per radical polymerizable group;

a-3: Reaction product of polypropoxylated glycerine (average molecular weight 270), tolylene diisocyanate and glycerine monoacrylate monomethacrylate at molar ratio of 1/3/3, having methacryloyl groups and acryloyl groups at molar ratio of 1/1 as radical polymerizable groups in the molecule and molecular weight of 240 per radical polymerizable group;

a-4: Reaction product of isophorone diisocyanate and glycerine monomethacrylate·monoacrylate at molar ratio of ½, having molecular weight of 163 per radical polymerizable group;

r-1: Reaction product of glycerine dimethacrylate and tolylene diisocyanate at molar ratio of 2/1;

r-2: Reaction product of glycerine diacrylate and tolylene diisocyanate at molar ratio of 2/1;

r-3: Reaction product of glycerine dimethacrylate, hydroxyethyl methacrylate and tolylene diisocyanate at molar ratio of 1/1/1;

r-4: Reaction product of glycerine diacrylate, hydroxyethyl acrylate and tolylene diisocyanate at molar ratio of 1/1/1;

r-5: Reaction product of glycerine polycaprolactone tri-ol (average molecular weight 1200), isophorone diisocyanate, glycerine monoacrylate monomethacrylate and hydroxyethyl methacrylate at molar ratio of 1/3/1.5/1.5, having molecular weight of 534 per radical polymerizable group;

r-6: Reaction product of glycerine monoacrylate monomethacrylate and isocyanatoethyl methacrylate at molar ratio of 1/3/1.5/1.5, having molecular weight of 534 per radical polymerizable group;

r-7: Reaction product of glycerine dimethacrylate and diphenylmethane diisocyanate at molar ratio of 2/1;

c-1: Dicyclopentyl dimethylene monoacrylate monomethacrylate;

c-2: Reaction product of neopentylglycol·hydroxy pivalate, methacrylic acid and acrylic acid at molar ratio of 1/1.2/0.8, having methacryloyl groups and acryloyl groups at molar ratio of 3/1 as radical polymerizable groups in the molecule;

c-3: Dicyclopentyl dimethylene diacrylate;

c-4: Neopentylglycol·hydroxy pivalate·diacrylate.

Part 2: Preparation of photocurable resin composition

Photocurable Liquid (A-1) prepared in Part 1 (100 parts), 1-hydroxy cyclohexylphenylketone (3 parts) as photoinitiator, glass beads with average particle diameter 17 μm (200 parts) and aluminum borate fibers with fiber diameter 0.8 μm and average fiber length 20 μm (50 parts) both surface-treated with methacryloyl oxypropyl trimethoxysilane as fillers, and morpholine salt of phosphoric acid ester of methoxypolyoxypropylene di-ol with average molecular weight of 2000 (2.5 parts) were placed inside a mixing container provided with a double-axis stirrer and stirred together until a uniform mixture was obtained. The stirred mixture was passed through a 50 μm filter to obtain photocurable resin composition (AS-1). Compositions (AS-2), (AS-3), (BS-1), (BS-2), (AQ-1)–(AQ-10) and (BQ-1)–(BQ-3) were similarly obtained. Their compositions are shown in Table 2. Of the above, Compositions (AS-1)–(AS-3), (BS-1) and (BS-2) are photocurable resin compositions used in methods embodying this invention.

TABLE 2

| PRC Kind | Liquid Kind | Photo-Initiator Kind | Amount | Fillers Particles Kind | Amount | Fibers Kind | Amount | Salt of phosphoric acid ester Kind | Amount |
|---|---|---|---|---|---|---|---|---|---|
| AS-1 | A-1 | G-1 | 3 | D-1 | 200 | E-1 | 50 | F-1 | 2.5 |
| AS-1 | A-2 | G-1 | 3 | D-1 | 200 | E-2 | 50 | F-1 | 2.5 |
| AS-3 | A-3 | G-1 | 3 | D-1 | 200 | E-1 | 50 | F-1 | 2.5 |
| BS-1 | B-1 | G-1 | 3 | D-1 | 200 | E-1 | 50 | F-1 | 2.5 |
| BS-2 | B-2 | G-1 | 3 | D-1 | 200 | E-1 | 50 | F-1 | 2.5 |
| AQ-1 | RA-1 | G-1 | 3 | D-1 | 200 | E-1 | 50 | F-1 | 2.5 |
| AQ-2 | RA-2 | G-2 | 3 | D-1 | 200 | E-1 | 50 | F-1 | 2.5 |
| AQ-3 | RA-3 | G-1 | 3 | D-1 | 200 | E-2 | 50 | F-1 | 2.5 |
| AQ-4 | RA-4 | G-2 | 3 | D-1 | 200 | E-2 | 50 | F-1 | 2.5 |
| AQ-5 | A-1 | G-1 | 3 | D-2 | 200 | E-3 | 50 | F-1 | 2.5 |
| AQ-6 | A-2 | G-1 | 3 | D-2 | 200 | E-3 | 50 | F-1 | 2.5 |
| AQ-7 | RA-5 | G-1 | 3 | D-1 | 200 | E-2 | 50 | F-1 | 2.5 |
| AQ-8 | RA-6 | G-1 | 3 | D-1 | 200 | E-2 | 50 | F-1 | 2.5 |
| AQ-9 | RA-7 | G-1 | 3 | D-1 | 200 | E-1 | 50 | F-1 | 2.5 |
| AQ-10 | RA-8 | G-2 | 3 | D-1 | 200 | E-1 | 50 | F-1 | 2.5 |
| BQ-1 | RB-1 | G-1 | 3 | D-1 | 200 | E-1 | 50 | F-1 | 2.5 |
| BQ-2 | B-1 | G-1 | 3 | — | — | E-1 | 50 | F-1 | 1.0 |
| BQ-3 | B-1 | G-1 | 3 | D-1 | 200 | — | — | F-1 | 2.0 | where:

PRC: Photocurable resin composition;

Liquid: Photocurable liquid;

Amount: In units of weight part;

G-1: 1-hydroxy cyclohexyl phenylketone;

G-2: 2,2-dimethoxy-2-phenylacetophenon;

D-1: Glass beads with average particle diameter 17 μm surface-treated with methacryloyloxypropyl trimethoxysilane;

D-2: Glass beads with average particle diameter 17 μm with no surface treatment;

E-1: Aluminum borate fibers with fiber diameter 0.8 μm and average fiber length 20 μm surface-treated with methacryloyloxypropyl trimethoxysilane;

E-2: Aluminum borate fibers with fiber diameter 1.0 μm and average fiber length 40 μm surface-treated with vinyl trimethoxysilane;

E-3: Aluminum borate fibers with fiber diameter 0.8 μm and average fiber length 20 μm with no surface treatment;

F-1: Morpholine salt of phosphoric acid ester of methoxypolyoxy propylene di-ol with average molecular weight of 2000.

Part 3:

(1) Production of plastic molds, sample pieces for the measurements of mechanical and thermal properties and layered structures for the measurement of glass transition temperature Test Example 1

An apparatus for stereolithography consisting mainly of a three-dimensional NC table equipped with a container and a control system of argon laser beam (output=400 mW; wavelength=3510 and 3640 Å) was used. This container was filled with photocurable resin composition (AS-1) prepared in Part 2 and photocurable resin composition (AS-1) was supplied from this container onto a horizontal surface (determined by X-axis and Y-axis) such that the thickness became 0.20 mm. Its surface (in the X–Y plane) was then scanned in the perpendicular direction (along the Z-axis) by a focused argon laser beam according to preliminarily inputted data in the three-dimensional CAD to harden a specified portion. The scanning was according to the normal Y method with scan line interval of 0.05 mm, exposure intensity (I in Tables 3 and 4) 14.0 mJ/cm$^2$ and depth of exposure (D in Tables 3 and 4) 0.30 mm. Another layer of photocurable resin composition (AS-1) with thickness (t in Table 3 and 4) 0.20 mm was supplied on top of this photocured object and it was similarly photocured. This process was repeated thereafter to produce a lower part with a total of 275 layers, an upper part with 300 layers to form a pair with the lower part, three layered structures each with 15 layers for measuring mechanical properties, one layered structure with 20 layers for measuring thermal properties and three layered structures for measuring glass transition temperature. After these photocured layered structures thus obtained were washed with isopropyl alcohol, the glass transition temperature (Tg in Tables 3 and 4) of the structures for its measurement was measured by a method described below. The measured glass transition temperature was 108° C. On the basis of this measured glass transition temperature, a post-cure temperature (Tc in Tables 3 and 4) was set equal to 160° C. and the layered structures for the lower part, the upper part, measurement of mechanical and thermal properties were subjected to a post-cure process at this temperature for 2 hours to obtain plastic molds shown in FIG. 1 and test pieces for measurement of mechanical and thermal properties according respectively to JIS-K7113 and JIS-K7207.

Test Examples 2–10 and Comparison Examples 1–21

Figure 1:
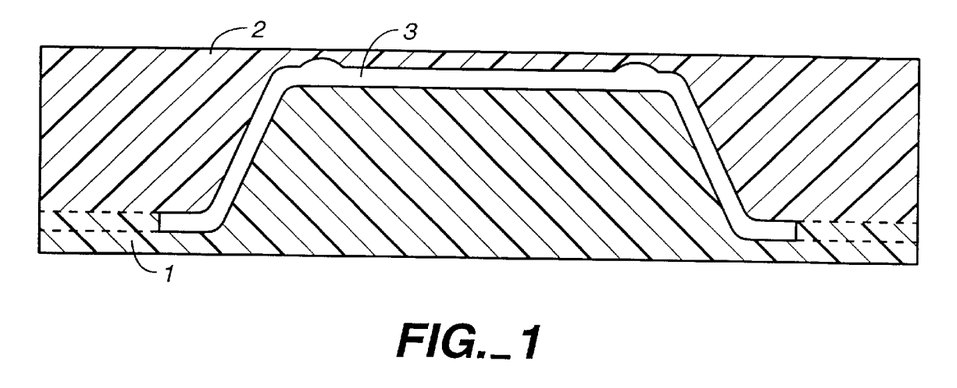
FIG. 1 is a longitudinal sectional view of a plastic mold produced as an example according to this invention.

The kind of photocurable resin composition, the thickness of its individual layers and the scan conditions were changed as shown in Tables 3 and 4 to obtain photocured layered structures as done for Test Example 1. Glass transition temperatures of these structures were measured as explained below. The structures for the upper and lower parts and for measurements of mechanical and thermal properties were subjected to a post-cure process at temperatures shown in Tables 3 and 4 as done in Test Example 1 to obtain plastic molds as shown in FIG. 1 and test pieces for the measurement of mechanical and thermal properties.

(2) Evaluations (2-1) Glass Transition Temperature

From each of the structures for the measurement of glass transition temperature obtained in (1), a test piece of 55 mm×10 mm×2 mm was cut out, and its dynamic viscoelasticity was measured to determine the glass transition temperature (Tg) indicated as the peak temperature obtained from the tan δ-temperature curve. Results are shown as the average from three sample structures.

(2—2) Mechanical Properties

Tensile strength (TS in Tables 3 and 4) and tensile elastic modulus (TEM in Tables 3 and 4) of each test piece obtained in (1) for the measurement of mechanical properties were measured according to JIS-K7113. Results are shown as the average from three test pieces.

(2-3) Thermal Properties

Heat distortion temperature (HDT in Tables 3 and 4) at bending force of 181.4 MPa was measured with each of the test pieces obtained in (1) for the measurement of thermal properties according to JIS-K7207. Results are shown in Tables 3 and 4.

(2–4) Compression Molding Test

Figure 2:
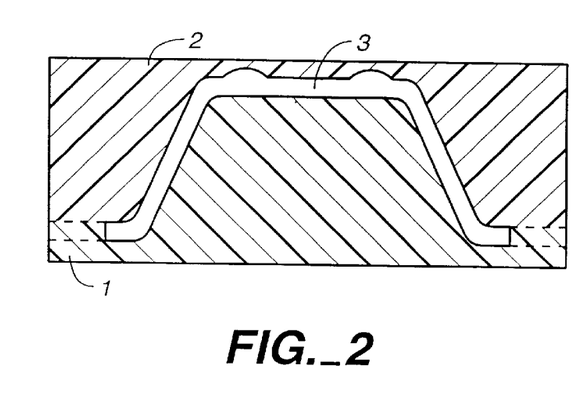
FIG. 2 is a transverse sectional view of the plastic mold of FIG. 1.

FIG. 1 is a longitudinal sectional view of the plastic mold produced as described above, and FIG. 2 is its transverse sectional view. The mold has a lower part 1 and an upper part 2 which together form a pair, having a molding space 3 formed therebetween. The lower part 1 is provided with a gas vent (not shown) connecting the molding space 3 with the exterior. A toy bathtub to be formed in the molding space 3 is a hollow container generally shaped like an inverted trapezoid with external dimensions of 177×110 nm for the planar surface, 105×65 mm for the bottom surface and 45 mm in height. Each of the plastic molds produced as described above was set on a 50-ton oil press equipped with electric heaters and heated until the lower part reached a set temperature of 145° C. and the upper part reached 140°. Zinc stearate was applied to the inner surfaces of the lower and upper parts as mold release agent. A bulk molding compound (BMC), comprising 85 parts of unsaturated polyester resin (Model 7341 produced by Nippon Upica Corporation), 5 parts of polystyrene, 10 parts of styrene monomer, 200 parts of aluminum hydroxide (B-103 produced by Nippon Keikinzoku Corporation), 3 parts of zinc stearate, 1 part of magnesium oxide, 1.5 parts of benzoyl peroxide and 90 parts of glass fibers with average fiber length of 3 mm, was inserted between the lower and upper parts for compression molding at 40-ton pressure for 4 minutes. This process was repeated, and every tenth product thus produced was inspect for defects to determine the number N (shown in Tables 3 and 4) of times the molding process could be repeated. If no defects were found in the first 100 products, the test was stopped, and N was shown as 100< in Tables 3 and 4.

TABLE 3

| PRC | | t | Conditions of scan | | Tg | Tc | Tc − Tg | N | Mechanical and thermal properties | | |
|---|---|---|---|---|---|---|---|---|---|---|---|
| | | | I | D | | | | | TS | TEM | HDT |

Test Examples

| 1 | AS-1 | 0.20 | 14.0 | 0.30 | 108 | 160 | 52 | 100< | 75.2 | 18.9 | 281 |
|---|------|------|------|------|-----|-----|----|------|------|------|-----|
| 2 | AS-1 | 0.20 | 12.0 | 0.24 | 102 | 160 | 54 | 100< | 72.4 | 18.1 | 277 |
| 3 | AS-1 | 0.05 | 2.6  | 0.06 | 95  | 160 | 65 | 100< | 74.9 | 18.3 | 280 |
| 4 | AS-2 | 0.20 | 11.0 | 0.24 | 81  | 150 | 69 | 100< | 78.7 | 17.4 | 265 |
| 5 | AS-2 | 0.05 | 4.0  | 0.075| 88  | 150 | 62 | 100< | 79.6 | 17.8 | 266 |
| 6 | AS-2 | 0.05 | 3.1  | 0.06 | 80  | 150 | 70 | 100< | 79.3 | 17.7 | 263 |
| 7 | AS-3 | 0.20 | 14.6 | 0.26 | 76  | 150 | 74 | 100< | 85.4 | 17.3 | 251 |
| 8 | AS-3 | 0.10 | 8.4  | 0.15 | 79  | 120 | 41 | 100< | 83.2 | 17.1 | 245 |
| 9 | BS-1 | 0.10 | 7.2  | 0.12 | 70  | 100 | 30 | 100< | 76.5 | 17.8 | 274 |
| 10| BS-2 | 0.10 | 8.1  | 0.11 | 70  | 100 | 30 | 90>  | 59.8 | 14.6 | 217 |

TABLE 4

| PRC | | t | Conditions of scan | | Tg | Tc | Tc − Tg | N | Mechanical and thermal properties | | |
|---|---|---|---|---|---|---|---|---|---|---|---|
| | | | I | D | | | | | TS | TEM | HDT |

Comparison Examples

| 1  | AQ-1  | 0.20 | 15.6 | 0.30 | 90  | 160 | 70  | 10> | 44.2 | 12.5 | 210 |
|----|-------|------|------|------|-----|-----|-----|-----|------|------|-----|
| 2  | AQ-2  | 0.20 | 13.9 | 0.30 | 104 | 160 | 56  | 0   | 53.9 | 8.8  | 126 |
| 3  | AQ-3  | 0.20 | 14.4 | 0.24 | 76  | 150 | 74  | 10> | 50.2 | 10.9 | 198 |
| 4  | AQ-4  | 0.20 | 13.2 | 0.24 | 79  | 150 | 71  | 0   | 57.1 | 9.0  | 124 |
| 5  | AQ-5  | 0.20 | 14.5 | 0.24 | 98  | 160 | 62  | 10> | 59.0 | 11.4 | 196 |
| 6  | AQ-6  | 0.20 | 11.2 | 0.24 | 80  | 150 | 70  | 10> | 62.2 | 9.4  | 184 |
| 7  | AQ-7  | 0.05 | 2.6  | 0.06 | 91  | 160 | 69  | 10> | 51.6 | 13.7 | 226 |
| 8  | AQ-8  | 0.05 | 3.4  | 0.06 | 75  | 150 | 75  | 20> | 60.3 | 12.2 | 204 |
| 9  | AS-1  | 0.05 | 2.6  | 0.06 | 95  | 100 | 5   | 10> | 53.2 | 12.8 | 196 |
| 10 | AS-1  | 0.05 | 2.6  | 0.06 | 95  | 210 | 115 | 20> | 60.7 | 14.3 | 262 |
| 11 | AS-1  | 0.05 | 2.3  | 0.05 | 50  | 150 | 100 | 10> | 52.4 | 14.9 | 279 |
| 12 | AS-1  | 0.05 | 10.7 | 0.25 | 151 | 200 | 49  | 30> | 58.0 | 15.5 | 261 |
| 13 | AS-2  | 0.20 | 11.0 | 0.24 | 81  | 100 | 19  | 20> | 61.1 | 12.4 | 205 |
| 14 | AS-2  | 0.20 | 11.0 | 0.24 | 81  | 200 | 119 | 20> | 63.4 | 14.6 | 249 |
| 15 | AS-2  | 0.20 | 9.1  | 0.20 | 62  | 160 | 98  | 20> | 55.6 | 15.1 | 252 |
| 16 | AS-2  | 0.20 | 55.1 | 0.40 | 129 | 200 | 71  | 20> | 56.8 | 14.6 | 233 |
| 17 | AQ-9  | 0.20 | 12.1 | 0.24 | 52  | 150 | 98  | 0   | 64.1 | 9.3  | 116 |
| 18 | AQ-10 | 0.20 | 10.6 | 0.24 | 115 | 200 | 85  | 10> | 45.5 | 12.0 | 280 |
| 19 | BQ-1  | 0.10 | 8.3  | 0.12 | 70  | 100 | 30  | 20> | 48.1 | 11.2 | 130 |
| 20 | BQ-2  | 0.10 | 8.0  | 0.11 | 70  | 100 | 30  | 0   | 69.6 | 5.5  | 82  |
| 21 | BQ-3  | 0.10 | 8.1  | 0.12 | 70  | 100 | 30  | 10> | 38.2 | 6.7  | 126 |

In Tables 3 and 4:
PRC: Photocurable resin composition;
t: Thickness (in mm) of each layer of layered structure;
I: Intensity of exposure (mJ/cm²);
D: Depth of exposure (mm);
Tg: Glass transition temperature (°C.);
Tg: Post-cure temperature (°C.);
N: Number of molding processes;
TS: Tensile strength (in MPa);
TEM: Tensile elastic modulus (in GPa);
HDT: Heat distortion temperature (°C.);
Small cracks appeared on molds in Comparison Examples 1, 3, 10, 11, 14 and 15;
Molds warped in Comparison Examples 12 and 16;
Molds warped and small cracked appeared in Comparison Example 18;
Tables 3 and 4 clearly show that plastic molds can be produced much more quickly by a method according to this invention than by prior art methods which require a master model to be preliminarily made, and that the molds produced by a method according to this invention have superior mechanical and thermal properties and hence improved resistance against use.

What is claimed is:

1. A method of producing a plastic mold comprising the steps of:

forming a layer of a photocurable resin composition containing 100 weight parts of a photocurable liquid, an effective amount of photoinitiator, 50–400 weight parts of a filler and less than 5 weight parts of salt of phosphoric acid ester per 100 weight parts of said filler; said photocurable liquid consisting of unsaturated urethane having a total of three or more methacryloyl groups and acryloyl groups as radical polymerizable groups per molecule and an average molecular weight per radical polymerizable group of 150–250 and a vinyl monomer which is N-(meth)acrylate morpholine or a mixture of N-(meth)acrylate morpholine and di-ol di(meth)acrylate at weight ratio of (unsaturated urethane)/(vinyl monomer)=80/20–30/70; said filler being a mixture of inorganic fine particles and inorganic whiskers of average fiber length 1–70 μm both surface-treated with (meth)acryloyl modified silane or vinyl modified silane; said salt of phosphoric acid ester being shown by Formula (1) given below:

Formula (1)

where R is a hydrocarbon group with 1–6 carbon atoms, Y is a residual group obtained by removing hydroxyl groups of polyether di-ol, B is monoamine base and m and n are each 1 or 2 such that m+n=3;

exposing said layer to actinic radiation to at least partially photocure said layer;

forming another layer of said photocurable resin composition on said at least partially photocured layer;

exposing said another layer to actinic radiation and thereby photocuring said another layer at least partially;

repeating the steps of forming another layer and exposing said another layer and thereby obtaining a photocured layered structure having a glass transition temperature of 70°–120° C.; and subjecting said photocured layered structure to a post-cure process at a post-cure temperature which is higher than said glass transition temperature by 30°–100° C. thereby producing a plastic mold.

2. The method of claim 1 wherein said photocurable liquid contains said unsaturated urethane by 30–80 weight %, N-(meth)acrylate morpholine by 3–10 weight % and di-ol di(meth)acrylate for the rest.

3. The method of claim 2 wherein said unsaturated urethane contains methacryloyl groups and acryloyl groups at a molar ratio of 1/3–2/1 as radical polymerizable groups in the molecule thereof.

4. The method of claim 1 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.3–1.0 μm and average fiber length 10–20 μm surface-treated with (meth)acryloyl modified silane or vinyl modified silane per 100 weight parts of said photocurable liquid.

5. The method of claim 2 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.3–1.0 μm and average fiber length 10–20 μm surface-treated with (meth)acryloyl modified silane or vinyl modified silane per 100 weight parts of said photocurable liquid.

6. The method of claim 3 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.3–1.0 μm and average fiber length 10–20 μm surface-treated with (meth)acryloyl modified silane or vinyl modified silane per 100 weight parts of said photocurable liquid.

7. A plastic mold produced by the steps of:

forming a layer of a photocurable resin composition containing 100 weight parts of a photocurable liquid, an effective amount of photoinitiator, 50–400 weight parts of a filler and less than 5 weight parts of salt of phosphoric acid ester per 100 weight parts of said filler; said photocurable liquid consisting of unsaturated urethane having a total of three or more methacryloyl groups and acryloyl groups as radical polymerizable groups per molecule and an average molecular weight per radical polymerizable group of 150–250 and a vinyl monomer which is N-(meth)acrylate morpholine or a mixture of N-(meth)acrylate morpholine and di-ol di(meth)acrylate at weight ratio of (unsaturated urethane)/(vinyl monomer)=80/20–30/70; said filler being a mixture of inorganic fine particles and inorganic whiskers of average fiber length 1–70 μm both surface-treated with (meth)acryloyl modified silane or vinyl modified silane; said salt of phosphoric acid ester being shown by Formula (1) given below:

Formula (1)

where R is a hydrocarbon group with 1–6 carbon atoms, Y is a residual group obtained by removing hydroxyl groups of polyether di-ol, B is monoamine base and m and n are each 1 or 2 such that m+n=3;

exposing said layer to actinic radiation to at least partially photocure said layer;

forming another layer of said photocurable resin composition on said at least partially photocured layer;

exposing said another layer to actinic radiation and thereby photocuring said another layer at least partially;

repeating the steps of forming another layer and exposing said another layer and thereby obtaining a photocured layered structure having a glass transition temperature of 70°–120° C.; and subjecting said photocured layered structure to a post-cure process at a post-cure temperature which is higher than said glass transition temperature by 30°–100° C.

8. The plastic mold of claim 7 wherein said photocurable liquid contains said unsaturated urethane by 30–80 weight %, N-(meth)acrylate morpholine by 3–10 weight % and di-ol di(meth)acrylate for the rest.

9. The plastic mold of claim 8 wherein said unsaturated urethane contains methacryloyl groups and acryloyl groups at a molar ratio of 1/3–2/1 as radical polymerizable groups in the molecule thereof.

10. The plastic mold of claim 7 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.3–1.0 μm and average fiber length 10–20 μm surface-treated with (meth)acryloyl modified silane or vinyl modified silane per 100 weight parts of said photocurable liquid.

11. The plastic mold of claim 8 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.4–1.0 μm and average fiber length 10–20 μm surface-treated with (meth)acryloyl modified silane or vinyl modified silane per 100 weight parts of said photocurable liquid.

12. The plastic mold of claim 9 wherein said photocurable resin composition contains as said filler 100–300 weight parts of glass beads with average particle diameter of 3–30 μm surface-treated with (meth)acryloyl modified silane or vinyl modified silane and 20–80 weight parts of aluminum borate fibers with fiber diameter 0.4–1.0 μm and average fiber length 10–20 μm surface-treated with (meth)acryloyl modified silane or vinyl modified silane per 100 weight parts of said photocurable liquid.

13. The plastic mold of claim 10 having heat distortion temperature higher than 240° C. and tensile elastic modulus greater than 17 GPa.

14. The plastic mold of claim 11 having heat distortion temperature higher than 240° C. and tensile elastic modulus greater than 17 GPa.

15. The plastic mold of claim 12 having heat distortion temperature higher than 240° C. and tensile elastic modulus greater than 17 GPa.

* * * * *